(12) United States Patent
Yasuda et al.

(10) Patent No.: US 7,843,034 B2
(45) Date of Patent: Nov. 30, 2010

(54) CAPACITOR HAVING UPPER ELECTRODE NOT FORMED OVER DEVICE ISOLATION REGION

(75) Inventors: Makoto Yasuda, Kawasaki (JP); Akiyoshi Watanabe, Kawasaki (JP); Yoshihiro Matsuoka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 10/924,956

(22) Filed: Aug. 25, 2004

(65) Prior Publication Data
US 2005/0199933 A1    Sep. 15, 2005

(30) Foreign Application Priority Data
Mar. 15, 2004    (JP) ................ 2004-73018

(51) Int. Cl.
*H01L 29/00*    (2006.01)
(52) U.S. Cl. .................. 257/532; 257/296; 257/306
(58) Field of Classification Search .......... 257/306, 257/296, 532
See application file for complete search history.

(56) References Cited
U.S. PATENT DOCUMENTS

| | | | | |
|---|---|---|---|---|
| 4,397,077 A * | 8/1983 | Derbenwick et al. | ........ | 438/251 |
| 4,466,177 A * | 8/1984 | Chao | .......... | 438/251 |
| 4,914,546 A | 4/1990 | Alter | | |
| 5,825,068 A * | 10/1998 | Yang | .......... | 257/380 |
| 6,171,928 B1 * | 1/2001 | Lou | ............. | 438/424 |
| 6,603,807 B1 * | 8/2003 | Yukutake et al. | ........... | 375/222 |
| 6,621,111 B2 * | 9/2003 | Hwang | ......... | 257/296 |
| 6,649,958 B2 * | 11/2003 | Fujisawa | .......... | 257/296 |
| 2003/0006442 A1 * | 1/2003 | Fujisawa | .......... | 257/296 |
| 2003/0104668 A1 | 6/2003 | Hwang | | |

(Continued)

FOREIGN PATENT DOCUMENTS

JP    60-145638 A    8/1985

(Continued)

OTHER PUBLICATIONS

Japanese Office Action dated Jun. 16, 2009, issued in corresponding Japanese Application No. 2004-073018.

(Continued)

*Primary Examiner*—Ori Nadav
(74) *Attorney, Agent, or Firm*—Westerman, Hattori, Daniels & Adrian, LLP

(57) ABSTRACT

The semiconductor device comprises a device isolation region 14 formed in a semiconductor substrate 10, a lower electrode 16 formed in a device region 12 defined by the device isolation region and formed of an impurity diffused layer, a dielectric film 18 of a thermal oxide film formed on the lower electrode, an upper electrode 20 formed on the dielectric film, an insulation layer 26 formed on the semiconductor substrate, covering the upper electrode, a first conductor plug 30a buried in a first contact hole 28a formed down to the lower electrode, and a second conductor plug 30b buried in a second contact hole 28b formed down to the upper electrode, the upper electrode being not formed in the device isolation region. The upper electrode 20 is not formed in the device isolation region 14, whereby the short-circuit between the upper electrode 20 and the lower electrode 16 in the cavity can be prevented. Thus, a capacitor of high reliability can be provided.

5 Claims, 15 Drawing Sheets

U.S. PATENT DOCUMENTS

2003/0183880 A1   10/2003   Goto et al.

FOREIGN PATENT DOCUMENTS

| JP | 1-140653     | * | 6/1989  |
|----|--------------|---|---------|
| JP | 8-107206   A |   | 4/1996  |
| JP | 10-41463   A |   | 2/1998  |
| JP | 2826149      |   | 9/1998  |
| JP | 2000-101071 A |  | 4/2000  |
| JP | 2000-208608 A |  | 7/2000  |
| JP | 2001-351917 A |  | 12/2001 |
| JP | 2003-60097    |  | 2/2003  |
| JP | 2003-218224   |  | 7/2003  |
| JP | 2003-282726 A |  | 10/2003 |
| JP | 2003-297941 A |  | 10/2003 |

OTHER PUBLICATIONS

Japanese Office Action dated Sep. 29, 2009, issued in corresponding Japanese Application No. 2004-073018.

* cited by examiner

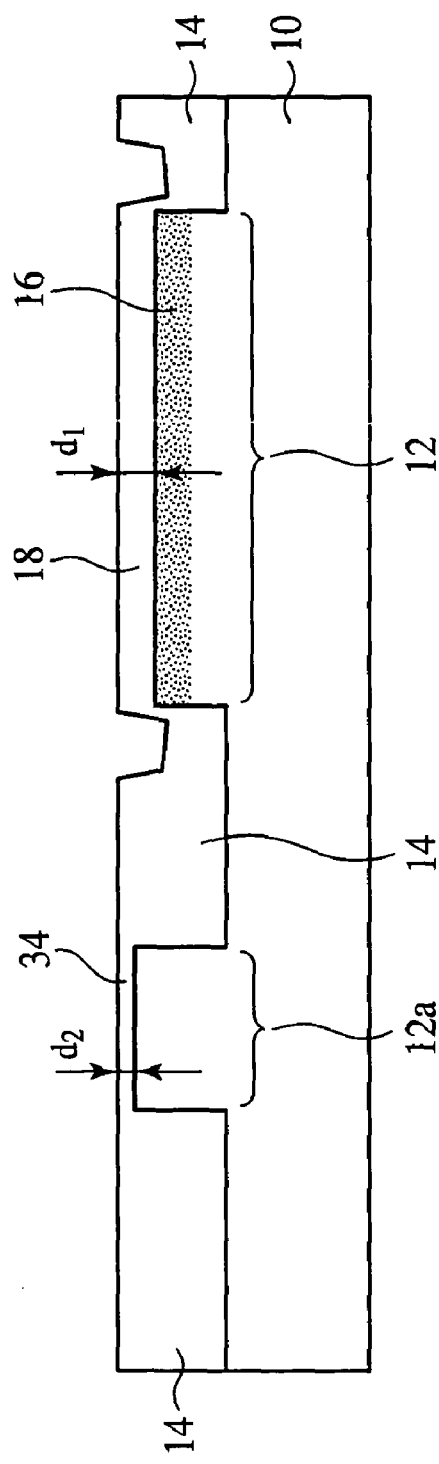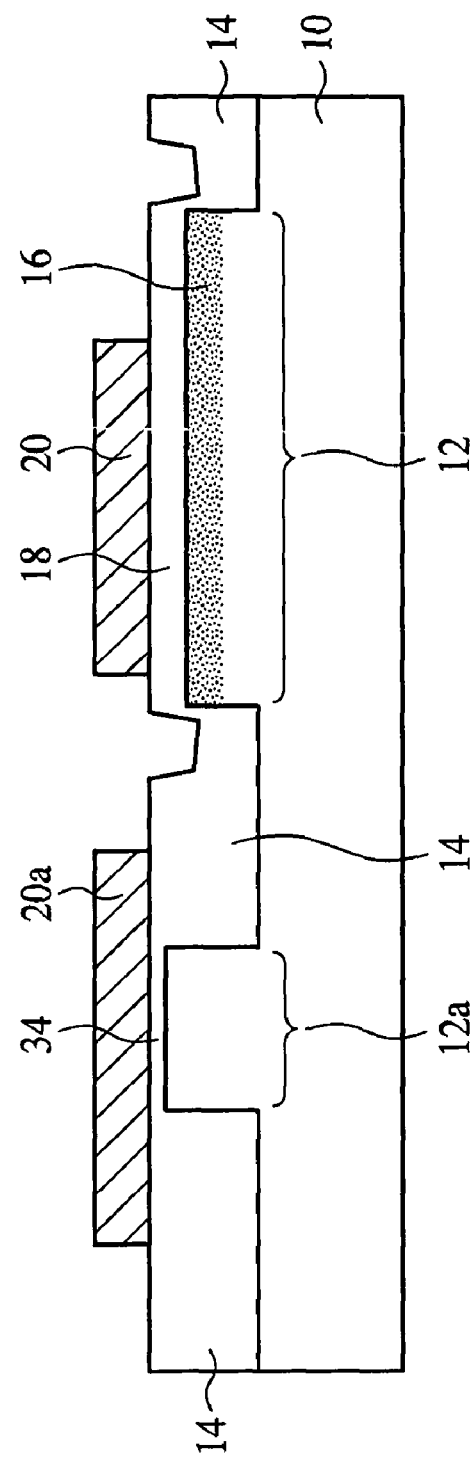
FIG. 9A
FIG. 9B

CAPACITOR HAVING UPPER ELECTRODE NOT FORMED OVER DEVICE ISOLATION REGION

CROSS-REFERENCE TO RELATED APPLICATION

This application is based upon and claims priority of Japanese Patent Application No. 2004-73018, filed on Mar. 15, 2004, the contents being incorporated herein by reference.

BACKGROUND OF THE INVENTION

The present invention relates to a capacitor and a method for fabricating the capacitor, and a semiconductor device including the capacitor and a method for fabricating the semiconductor device.

Recently, semiconductor devices including semiconductor elements, such as transistors, etc., and capacitors formed on one and the same substrates are noted.

For example, a capacitor comprising a lower electrode of a heavily doped impurity diffused layer buried in a semiconductor substrate, a dielectric film formed by thermally oxidizing the surface of the semiconductor substrate, and an upper electrode formed on the dielectric film is known.

A semiconductor device having semiconductor elements and the capacitors formed on one and the same substrate can remove noises by the capacitors without leading the interconnections outside the semiconductor device and accordingly can realize more stable operation.

Following references disclose the background art of the present invention.

[Patent Reference 1]
Specification of Japanese Patent Application Unexamined Publication No. 2003-218224

[Patent Reference 2]
Specification of Japanese Patent Application Unexamined Publication No. 2003-60097

[Patent Reference 3]
Specification of Japanese Patent No. 2826149

However, such capacitors do not have high reliability.

SUMMARY OF THE INVENTION

An object of the present invention is to provide a capacitor of high reliability and a method for fabricating the capacitor, a semiconductor device using the capacitor and a method for fabricating the semiconductor device.

According to one aspect of the present invention, there is provided a capacitor comprising: a device isolation region formed on a semiconductor substrate; a lower electrode formed in a device region defined by the device isolation region, and formed of an impurity diffused layer; a dielectric film formed of a thermal oxide film formed over the lower electrode; an upper electrode formed over the dielectric film; an insulation layer formed over the semiconductor substrate, covering the upper electrode; a first conductor plug buried in a first contact hole which is down to the lower electrode; and a second conductor plug buried in a second contact hole which is down to the upper electrode, the upper electrode being not formed over the device isolation region.

According to another aspect of the present invention, there is provided a semiconductor device comprising: a device isolation region formed in a semiconductor substrate; a transistor including a gate insulation film formed of a thermal oxide film formed in a first device region defined by the device isolation region, and a gate electrode formed over the gate insulation film and the device isolation region; a capacitor including a lower electrode formed in a second device region defined by the device isolation region, a dielectric film formed over the lower electrode and formed of a thermal oxide film thicker than the gate insulation film; and an upper electrode formed over the dielectric film; an insulation film formed over the semiconductor substrate, covering the transistor and the capacitor; a first conductor plug buried in a first contact hole which is down to the lower electrode; a second conductor plug buried in a second contact hole which is down to the upper electrode; and a third conductor plug buried in a third contact hole which is down to the gate electrode, the upper electrode of the capacitor being not formed over the device isolation region.

According to further another aspect of the present invention, there is provided a method for fabricating a capacitor comprising the steps of: forming a device isolation region in a semiconductor substrate; forming a sacrifice oxidation film on the surface of the device region defined by the device isolation region; implanting an impurity in a region containing the device region to form a lower electrode of an impurity diffused layer: etching off the sacrifice oxidation film; forming a dielectric film on the surface of the impurity diffused layer by thermal oxidation; forming an upper electrode over the dielectric film; forming an insulation layer, covering the upper electrode; etching the insulation layer to form a first contact hole down to the lower electrode and a second contact hole down to the upper electrode; and burying the first conductor plug in the first contact hole and burying the second conductor plug in the second contact hole, in the step of forming the upper electrode, the upper electrode is not formed over the device isolation region.

According to further another aspect of the present invention, there is provided a method for fabricating a semiconductor device comprising the steps of: forming a device isolation region in a semiconductor substrate; forming a sacrifice oxidation film on the surface of a device region defined by the device isolation region and the surface of another device region defined by the device isolation region; implanting an impurity into a region containing said another device region to form a lower electrode of a impurity diffused layer; etching off the sacrifice oxidation film; forming a gate insulation film on the surface of the device region, and a dielectric film thicker than the gate insulation film on the surface of the impurity diffused layer, by thermal oxidation; forming a gate electrode over the gate insulation film and the device isolation region, and an upper electrode over the dielectric film; forming an insulation layer, covering the gate electrode and the upper electrode; etching the insulation layer to form a first contact hole down to the lower electrode, a second contact hole down to the first electrode and a third contact hole down to the gate electrode; and burying a first conductor plug, a second conductor plug and a third conductor plug respectively in the first contact hole, the second contact hole and the third contact hole, in the step of forming the upper electrode, the upper electrode being not formed over the device isolation region.

According to the present invention, the upper electrode is not formed in the device isolation region, whereby the short-circuit between the upper electrode and the lower electrode in the cavity can be prevented. Thus, the present invention can provide a capacitor of high reliability.

The present invention can provide a capacitor of high reliability, and accordingly can provide a semiconductor device of high reliability.

BRIEF DESCRIPTION OF THE DRAWINGS

FIGS. 9A and 9B are sectional views of the semiconductor device in the steps of the semiconductor device fabricating method according to the second embodiment of the present invention (Part 2).

DETAILED DESCRIPTION OF THE INVENTION

Principle of the Present Invention

Figure 12A:
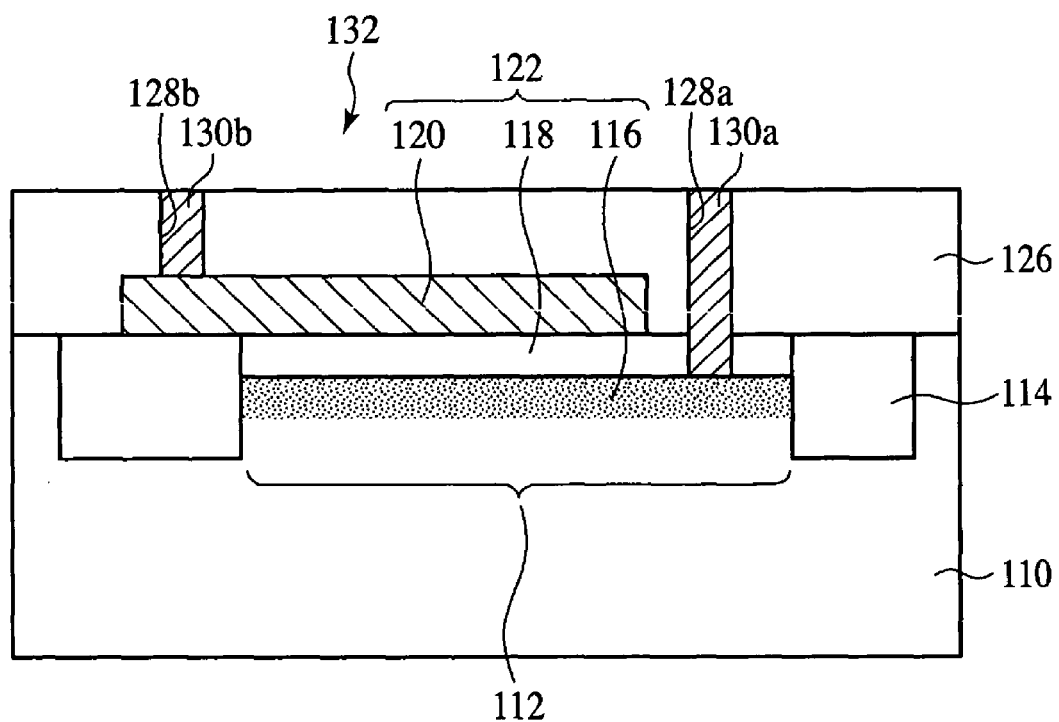
FIGS. 12A and 12B are diagrammatic views of the proposed capacitor.
Figure 12B:
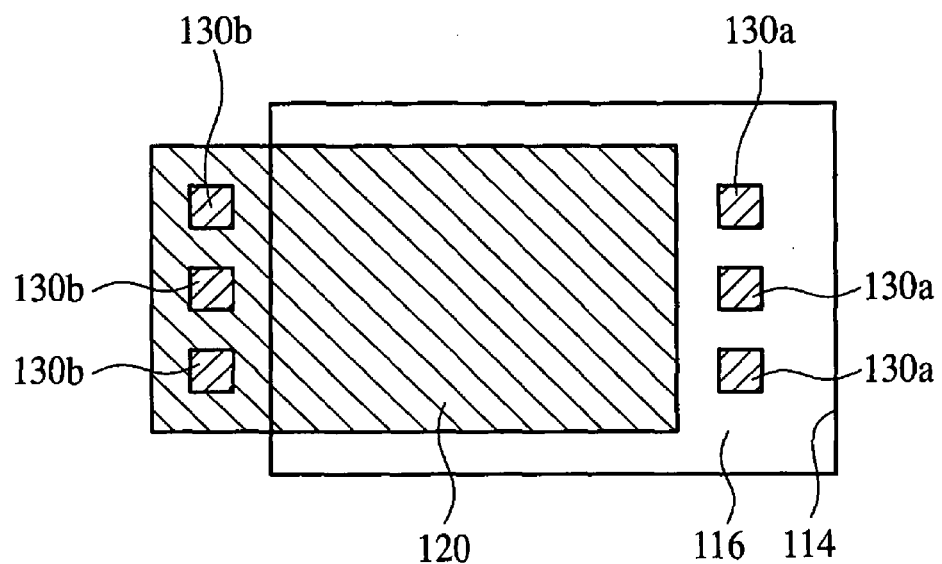

A proposed capacitor will be explained with reference to FIGS. 12A and 12B. FIGS. 12A and 12B are diagrammatic views of the proposed capacitor. FIG. 12A is a sectional view of the proposed capacitor. FIG. 12B is a plane view of the proposed capacitor.

As illustrated in FIGS. 12A and 12B, a device isolation region 114 is formed in a silicon substrate 110. In a device region 112 defined by the device isolation region 114, a lower electrode 116 of a heavily doped impurity diffused layer is formed.

A dielectric film 118 is formed on the lower electrode 116. The dielectric film 118 is formed by thermally oxidizing the surface of the heavily doped impurity diffused layer 116. When the heavily doped impurity diffused layer 116 is thermally oxidized, the phenomena that the oxidation advances due to the presence of the dopant impurity. This phenomena is called accelerating oxidation. Because of the accelerating oxidation taking place when the dielectric film 118 is formed, the dielectric film 118 is formed relatively thick.

An upper electrode 120 of polysilicon is formed on the dielectric film 118. The upper electrode 120 is formed not only over the device region 112 but also over the device isolation region 114. The lower electrode 116, the dielectric film 118 and the upper electrode 120 form a capacitor 122.

An inter-layer insulation film 126 is formed on a silicon substrate 110 with the upper electrode 120, etc. formed on. In the inter-layer insulation film 126, a contact hole 128b and a contact hole 128a are formed respectively down to the upper electrode 120 and down to the lower electrode 116. Conductor plugs 130a, 130b are buried respectively in the contact holes 128a, 128b.

Thus, the proposed capacitor 132 is constituted.

In the proposed capacitor, an impurity is heavily doped in the lower electrode 116, which makes it difficult for the lower electrode 116 to be depleted when a voltage is applied to the upper electrode 120. Because of the dielectric film 118 which is formed relatively thick by the accelerating oxidation, the electric field between the lower electrode 116 and the upper electrode 120 is relatively small. The proposed capacitor 132, in which the lower electrode 116 is not easily depleted, and the electric field between the lower electrode 116 and the upper electrode 120 is relatively small, can have relatively low voltage dependency.

However, the reliability of the proposed capacitor is not so high.

Figure 13:
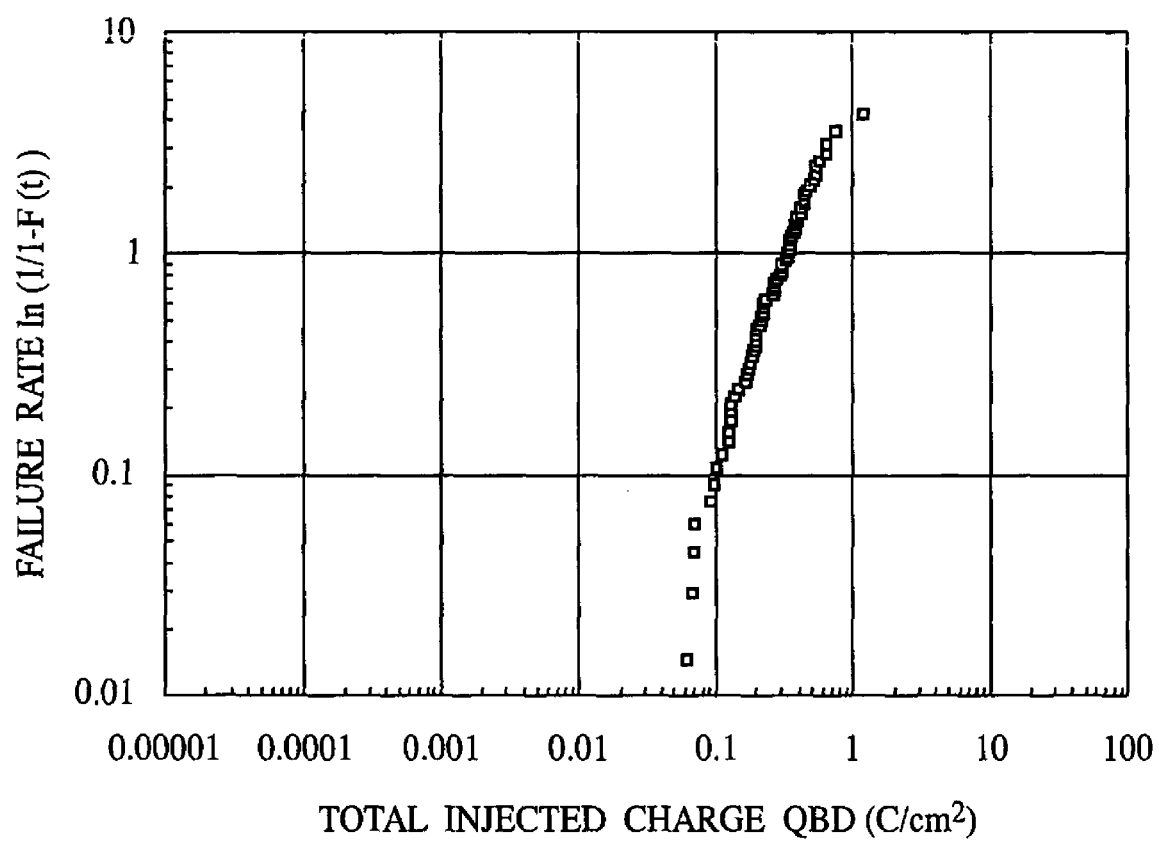
FIG. 13 is a graph of the failure rate of the proposed capacitor.

FIG. 13 is a graph of the failure rate of the proposed capacitor. The graph is shown in Weibull plot. On the horizontal axis, the total charge injection amount QBD required until the dielectric breakdown takes place. The failure rates ln(1/1−F(t)) are taken on the vertical axis. F(t) is a failure rate distribution function.

As seen in FIG. 13, the dielectric breakdown took place below the total charge injection amount of 1 C/cm$^2$. The total charge injection amount QBD required until the dielectric breakdown took place are largely dispersed.

Thus, the reliability of the proposed capacitor is not so high.

The inventors of the present application have investigated causes for the low reliability of the proposed capacitor.

FIGS. 14A to 15B are sectional views of the proposed capacitor in the steps of the method for fabricating the proposed capacitor, which illustrate the method.

Figure 14A:
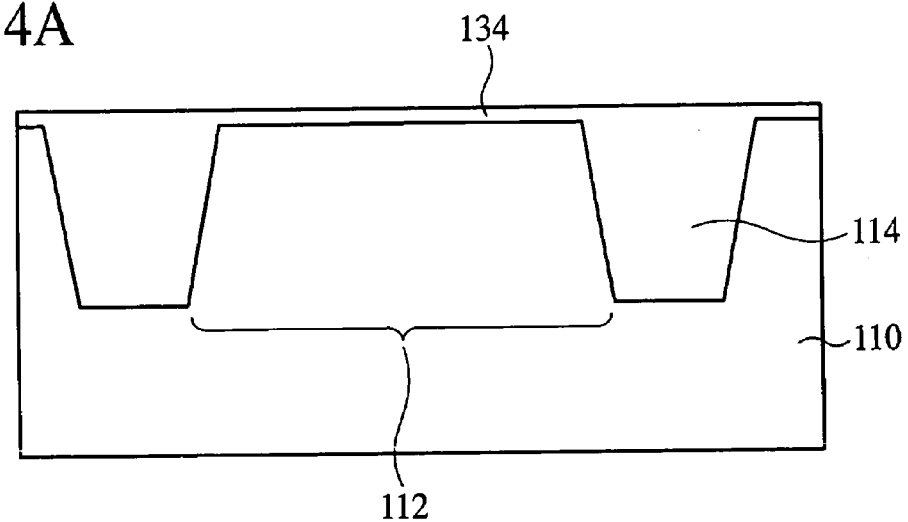
FIGS. 14A to 14C are sectional views of the proposed capacitor in the steps of the method for fabricating the capacitor, which illustrate the method (Part 1).
Figure 14B:
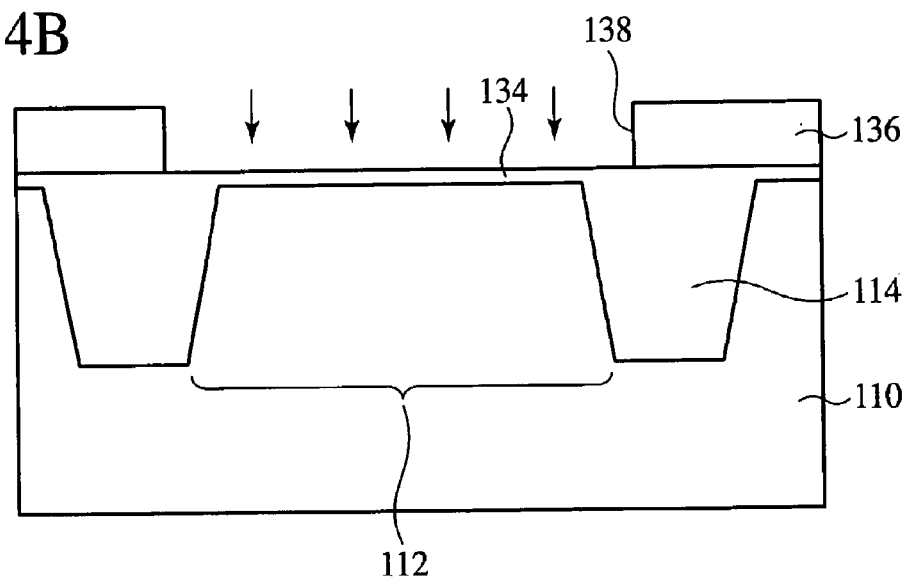
Figure 14C:
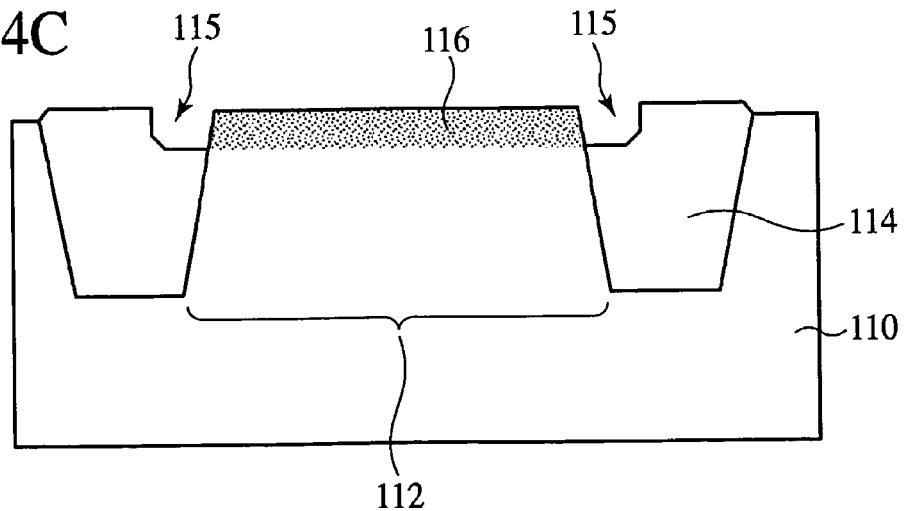

First, as illustrated in FIG. 14A, the device isolation region 114 is formed in the silicon substrate 110 by, e.g., STI. The device isolation region 114 defines the device region 112. Then, a sacrifice oxidation film 134 is formed on the surface of the semiconductor substrate 110.

Then, a photoresist film 136 is formed on the entire surface. Next, an opening 138 for exposing the device region 112 is formed in the photoresist film 136. Then, with the photoresist film 136 as the mask a dopant impurity is heavily implanted. Thus, the lower electrode 116 of the heavily doped impurity diffused layer is formed (see FIG. 14B).

Next, the sacrifice oxidation film 134 is etched off by using, e.g., hydrofluoric acid. In the device isolation region 114 nearer to the device region 112, the dopant impurity is more heavily implanted, and the etching advances at higher rate. Thus, a cavity 115 is formed in the device isolation region 114 nearer to the device region 112 (see FIG. 14C).

Figure 15A:
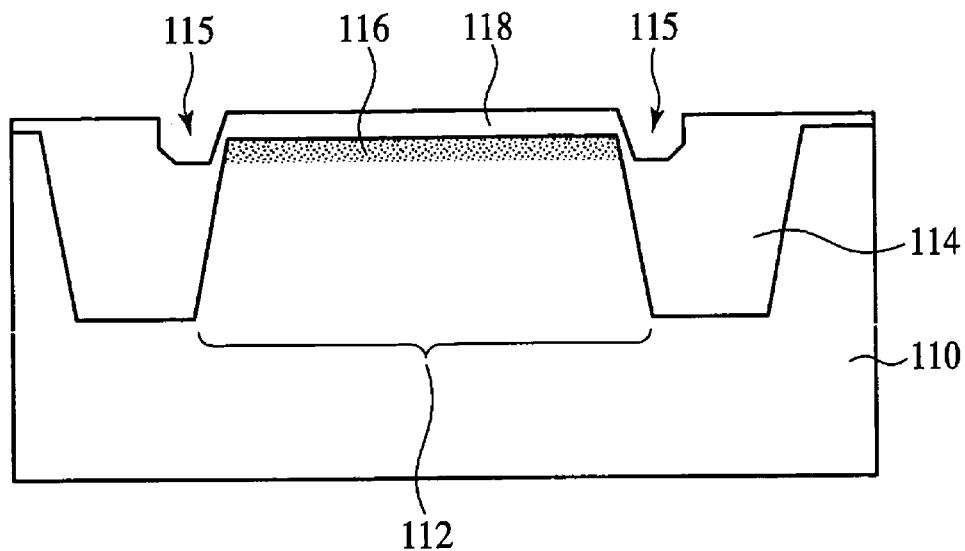
FIGS. 15A and 15B are sectional views of the proposed capacitor in the steps of the method for fabricating the capacitor, which illustrate the method (Part 2).

Then, as illustrated in FIG. 15A, the dielectric film 118 of a silicon oxide film is formed on the surface of the silicon substrate 110 by thermal oxidation. The dielectric film 118, which is formed by thermally oxidizing the heavily doped impurity diffused layer, is formed of the silicon oxide film 118 of a relatively thick film thickness due to the accelerating oxidation caused by the presence of the dopant impurity. The accelerating oxidation is oxidation which advances at high rates due to the presence of an impurity. The accelerating oxidation does not occur in the region where the dopant impurity is not been heavily implanted, and the film thickness of the silicon oxide film there is relatively small. The accelerating oxidation occurs in the region where the dopant impurity is heavily implanted, and the film thickness of the silicon oxide film there is relatively large.

Next, the upper electrode 120 of a polysilicon film with a dopant impurity implanted is formed.

Then, the inter-layer insulation film 126 is formed on the entire surface.

Then, the opening 128b and the opening 128a are formed in the inter-layer insulation film 126 respectively down to the upper electrode 120 and the lower electrode 116 by photolithography.

Then, the conductor plugs 130a, 130b are buried respectively in the openings 128a, 128b.

Figure 15B:
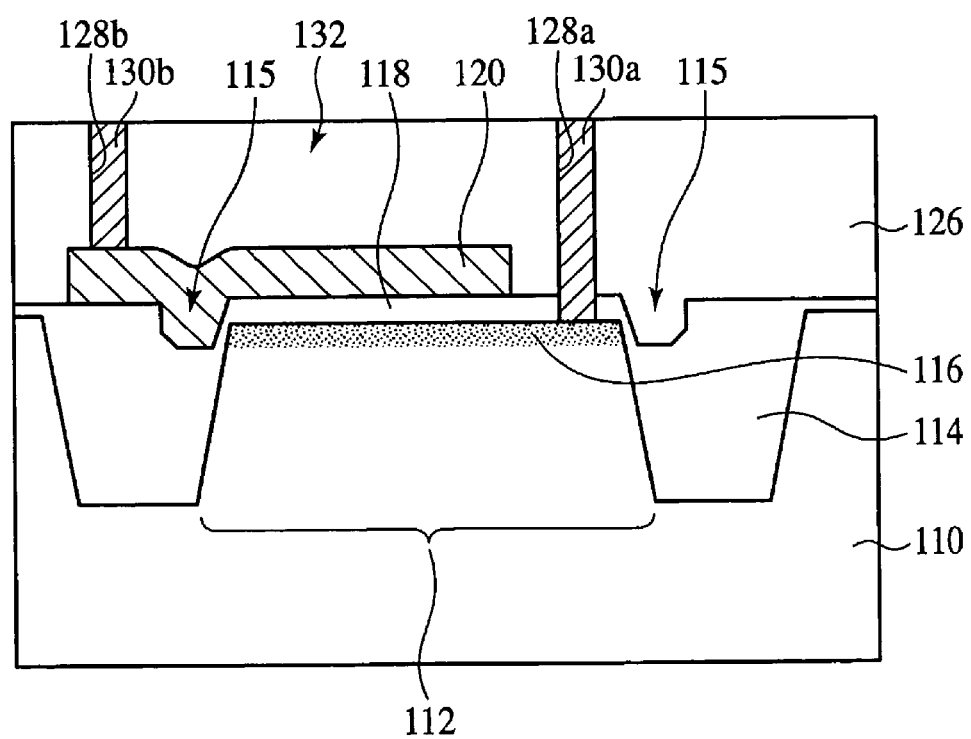

Thus, the capacitor 132 including the lower electrode 116, the dielectric film 118 and the upper electrode 120 is formed (see FIG. 15B).

As illustrated in FIG. 15B, the film thickness of the dielectric film 118 in the cavity 115 is very small. Furthermore, the dielectric film 118, which is formed by oxidizing the heavily doped impurity diffused layer 118, will not have good film quality. Accordingly, in the proposed capacitor 132, the dielectric breakdown occurs in the cavity 115, which will be a cause for the low reliability.

Based on the above-described results of the investigation, the inventors of the present application has had an idea that the absence of the upper electrode 120 in the cavity 115 prevents the short-circuit between the upper electrode 120 and the lower electrode 116, which improve the reliability of the capacitor.

A First Embodiment

Figure 1A:
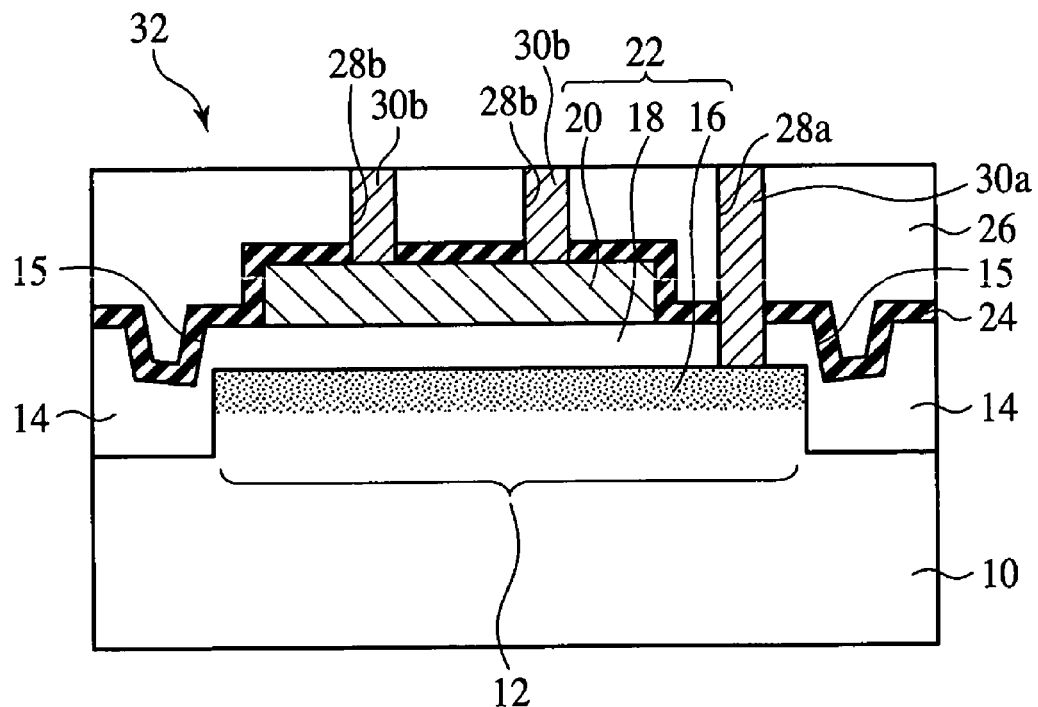
FIGS. 1A and 1B are a sectional view and a plane view of the capacitor according to a first embodiment of the present invention.
Figure 1B:
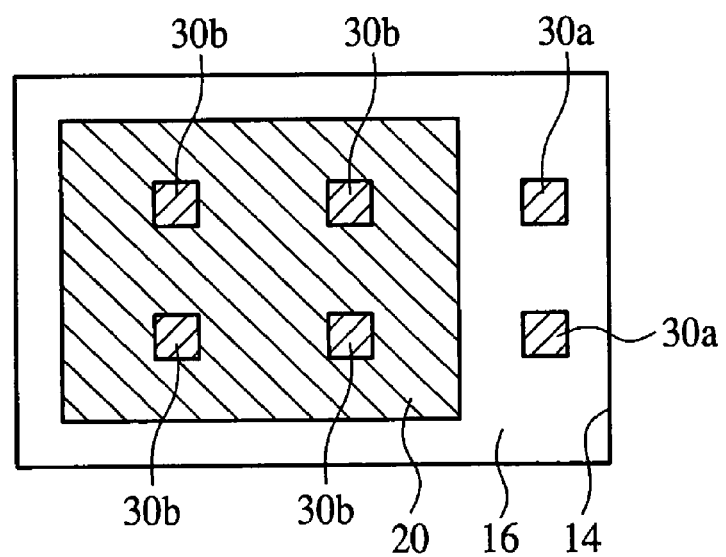

The capacitor according to a first embodiment of the present invention and a method for fabricating the capacitor will be explained with reference to FIGS. 1A to 6C. FIG. 1A is a sectional view of the capacitor according to the present embodiment. FIG. 1B is a plane view of the capacitor according to the present embodiment.

(The Capacitor)

First, the capacitor according to the present embodiment will be explained with reference to FIGS. 1A and 1B.

As illustrated in FIGS. 1A and 1B, a device isolation region 14 for defining a device region 12 is formed in a semiconductor substrate 10. The semiconductor substrate 10 is, e.g., a p type semiconductor substrate, more specifically a p type silicon substrate. The device isolation region 14 is formed by, e.g., STI (Shallow Trench Isolation).

A cavity 15 is formed in the device isolation region 14 near the device region 12.

A P type well (not illustrated) is formed in the device region 12.

In the device region 12, a lower electrode 16 of, e.g., an N+ type heavily doped impurity diffused layer is formed. The dopant impurity is, e.g., arsenic (As+). The lower electrode 16 is formed in contact with the device isolation region 14. The peak value of the concentration of the dopant impurity in the lower electrode 16 is, e.g., $1 \times 10^{20}$ cm$^{-3}$ or more. The impurity concentration of the lower electrode 16 is set to be so high so as to prevent the depletion of the lower electrode 16.

A dielectric film (capacitor dielectric film) 18 is formed on the lower electrode 16. The dielectric film 18 is formed by thermally oxidizing the N+ type heavily doped impurity diffused layer 16. The oxidation of the region 16 where the dopant impurity is heavily implanted advances at a higher rate than the oxidation of the region where the dopant impurity is not heavily implanted. The oxidation of the former advances at a higher rate because the dopant impurity advances the oxidation. Accordingly, when the region 16 where the dopant impurity is heavily implanted and the region where the dopant impurity is not heavily implanted are thermally oxidized concurrently, the film thickness of the oxide film 18 formed on the surface of the region 16 is larger than the film thickness of the oxide film formed on the surface of the region where the dopant impurity is not heavily implanted. Under conditions for forming the oxide film of, e.g., an about 7 nm-thickness on the surface of the silicon substrate where the dopant impurity is not heavily implanted, the oxide film of, e.g., an about 14 nm-thickness is formed on the surface of the silicon substrate where the dopant impurity is heavily implanted. Such phenomena is called an accelerating oxidation, and the oxide film thus formed is called an accelerating oxide film. With the peak value of the concentration of the dopant impurity in the lower electrode 16 being, e.g., $1 \times 10^{20}$ cm$^{-3}$ or more, the dielectric film 18 of a sufficient thickness can be formed by the accelerating oxidation.

An upper electrode 20 is formed on the dielectric film 18 of the accelerating oxide film. The upper electrode 20 is, e.g., a polysilicon film with an impurity implanted (doped polysilicon film). The upper electrode 20 is not formed over the device isolation region. In the present embodiment, the upper electrode 20 is not formed over the device isolation region 14 so as to prevent the short-circuit between the lower electrode 16 and the upper electrode 20 in the cavity 15.

The lower electrode 16, the dielectric film 18 and the upper electrode 20 form a capacitor 22.

An etching stopper film 24 is formed on the semiconductor substrate 10 with the capacitor 22 formed on. The etching stopper film 24 is, e.g., silicon nitride film.

An inter-layer insulation film 26 is formed on the semiconductor substrate 10 with the etching stopper film 24 formed on. The inter-layer insulation film 26, e.g., a silicon oxide film.

In the inter-layer insulation film 26 and the etching stopper film 24, a contact hole 28a and a contact hole 28b are formed respectively down to the lower electrode 16 and the upper electrode 20.

Conductor plugs 30a, 30b are buried respectively in the contact holes 28a, 28b. The material of the conductor plugs 30a, 30b is tungsten.

Figure 2:
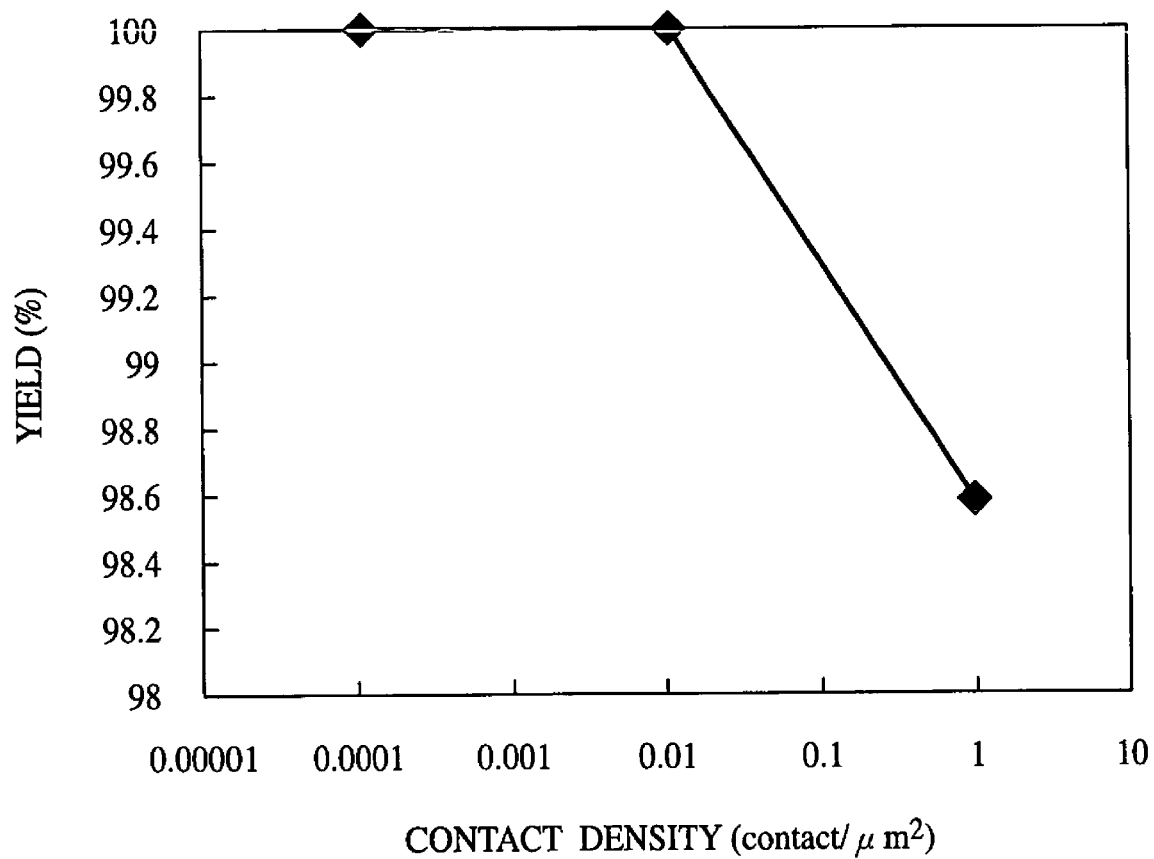
FIG. 2 is a graph of relationships between the density of contacts and the yield.

FIG. 2 is a graph of relationships between the density of the contacts and the yield. On the horizontal axis, the densities of the contacts by means of the conductor plug 30a are taken. On the vertical axis, the yields are taken. As seen in FIG. 2, preferably, the density of the contacts by means of the conductor plugs 30a is set, e.g., at 0.01 contacts/μm$^2$ or less.

The capacitor 32 according to the present embodiment is thus constituted.

(Evaluation Result)

Figure 3:
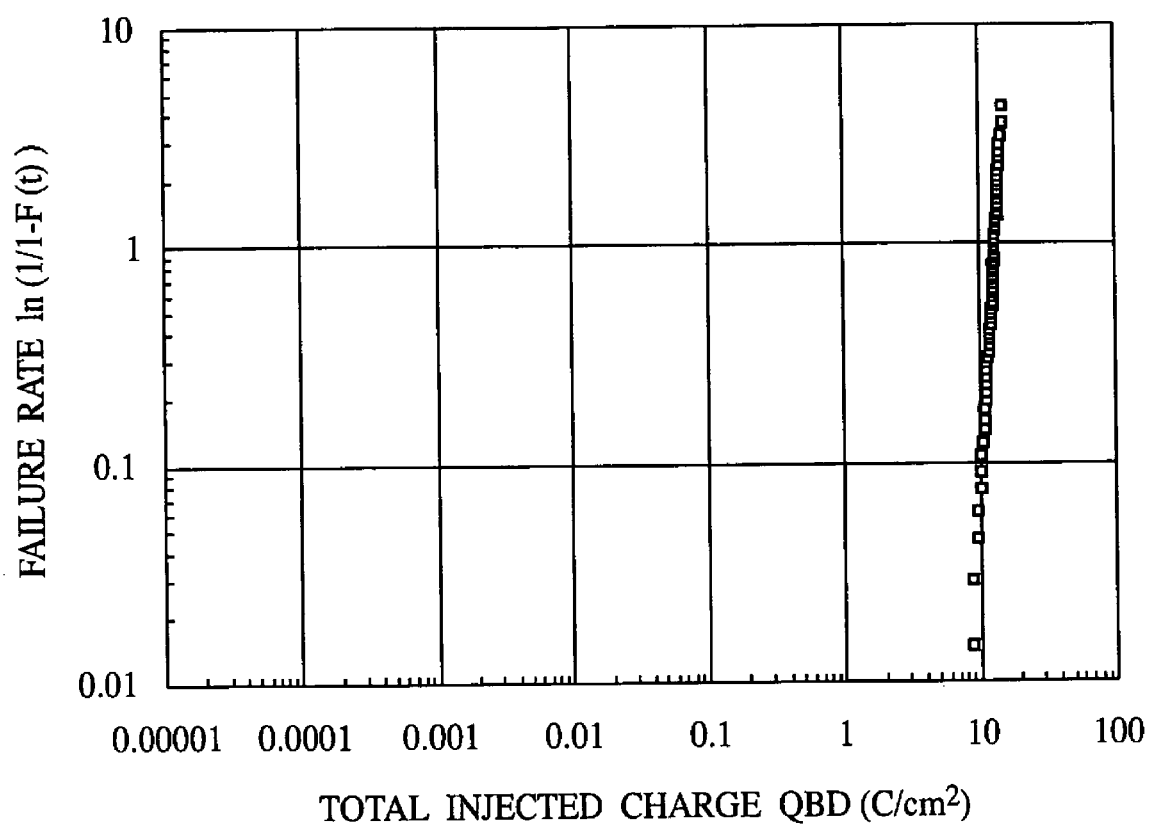
FIG. 3 is a graph of the failure rate of the capacitor according to the first embodiment of the present invention.

The result of evaluating the capacitor according to the present embodiment will be explained with reference to FIG. 3. FIG. 3 is a graph of the failure rate of the capacitor according to the present embodiment. The graph is shown in Weibull plot. On the horizontal axis total charge injection amount QBD (C/cm$^2$) required until the dielectric breakdown took place. On the vertical axis, the failure rates ln(1/1−F(t)) are taken. The F(t) is the failure distribution function.

As seen in FIG. 3, the total charge injection amount QBD required to cause the dielectric breakdown is above about 10 C/cm$^2$. The dispersion of the total charge injection amount QBD required to cause the dielectric breakdowns are very small. Based on this, it can be seen that the capacitor according to the present embodiment can have high reliability.

(The Method for Fabricating the Capacitor)

Next, the capacitor according to the present embodiment will be explained with reference to FIGS. 4A to 6C. FIGS. 4A to 6C are sectional views of the capacitor according to the present embodiment in the steps of the method for fabricating the capacitor, which illustrate the method.

Figure 4A:
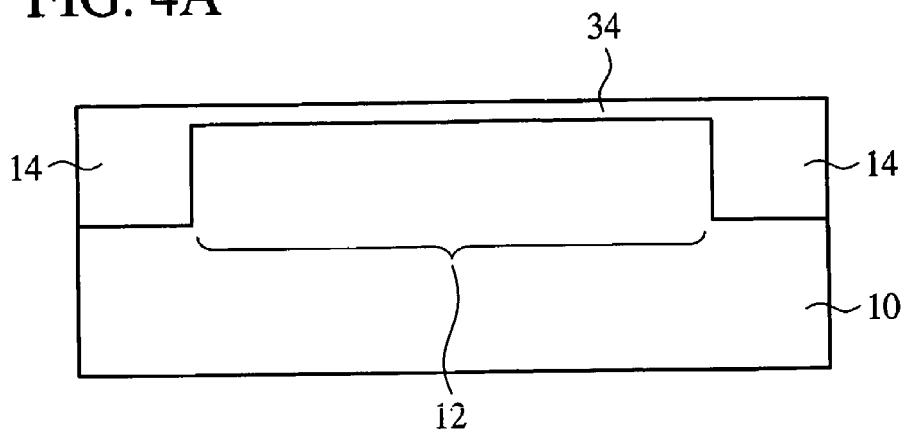
FIGS. 4A to 4C are sectional views of the capacitor according to the first embodiment of the present invention in the steps of the method for fabricating the capacitor, which illustrate the method (Part 1).

As illustrated in FIG. 4A, the device isolation region 14 is formed on the semiconductor substrate 10 by, e.g., STI. The semiconductor substrate 10 is, e.g., a silicon substrate. The device isolation region 14 defines the device region 12.

Next, the sacrifice oxidation film 34 is formed on the surface of the semiconductor substrate 10 by thermal oxidation.

Next, a dopant impurity is implanted into the device region 12 to thereby form, e.g., the P type well (not illustrated) in the semiconductor substrate 10.

Then, a photoresist film 36 is formed on the entire surface by, e.g., spin coating.

Figure 4B:
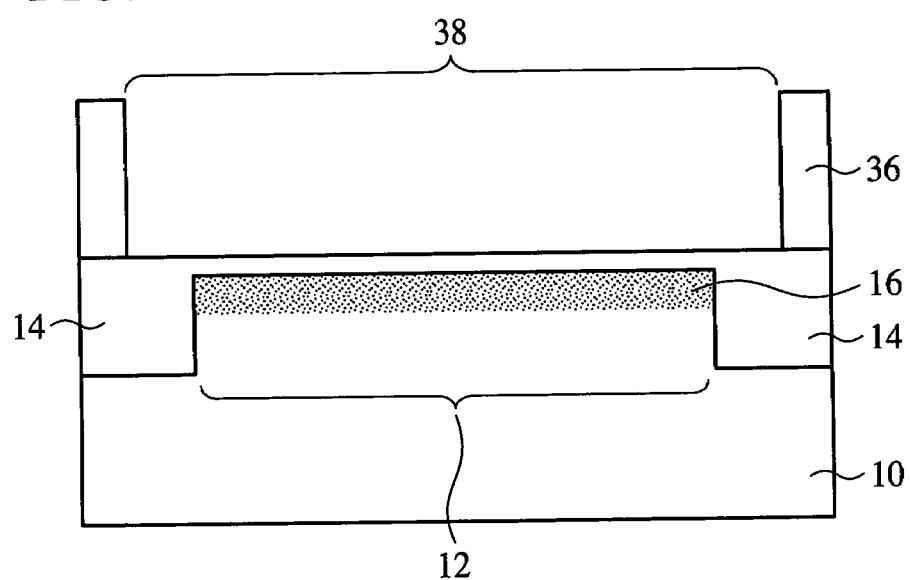

Next, as illustrated in FIG. 4B, the opening 38 is formed in the photoresist film 36 by photolithography. The opening 38 is formed, exposing not only the device region 12 but also the device isolation region 14 around the device region 12.

Then, with the photoresist film 36 as the mask, an N type dopant impurity is heavily implanted in the device region 12 by, e.g., ion implantation. The dopant impurity is implanted also into the device isolation region 14 around the device region 12. The dopant impurity is implanted into the semiconductor substrate 10 through the sacrifice oxidation film 34. The dopant impurity is, e.g. arsenic (As$^+$). Conditions for the ion implantation are, e.g., a 60 keV acceleration voltage and a 1.0×10$^{15}$ cm$^{-2}$ dose. The lower electrode 16 of the heavily doped impurity diffused layer is thus formed in the device region 12.

Figure 4C:
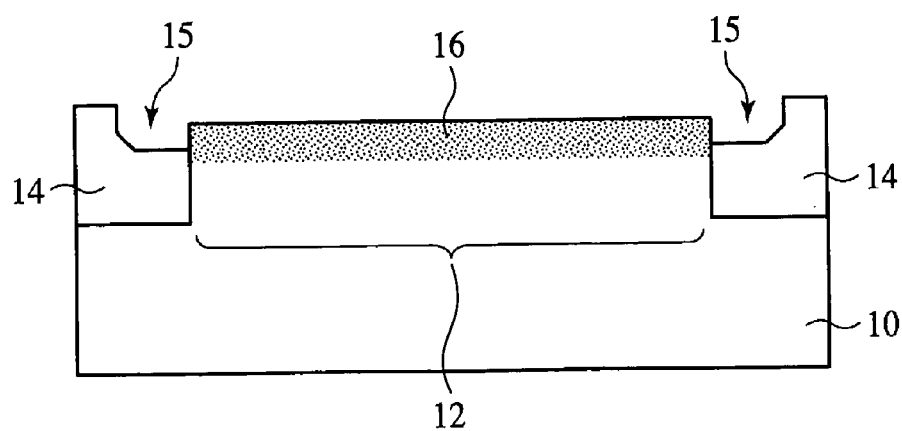

Next, as illustrated in FIG. 4C, the sacrifice oxidation film 34 on the surface of the semiconductor substrate 10 is etched off by using, e.g., a hydrofluoric acid solution. When the sacrifice oxidation film 34 is removed, the deice isolation region 14 around the device region 12, where the dopant impurity is heavily implanted, is etched more deeply. The cavity 15 is thus formed in the device isolation region 14 around the device region 12.

Figure 5A:
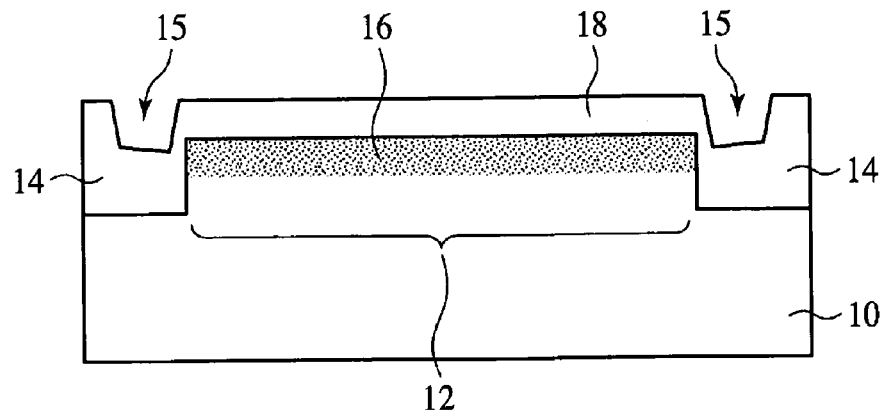
FIGS. 5A to 5C are sectional views of the capacitor according to the first embodiment of the present invention in the steps of the method for fabricating the capacitor, which illustrate the method (Part 2).
Figure 5B:
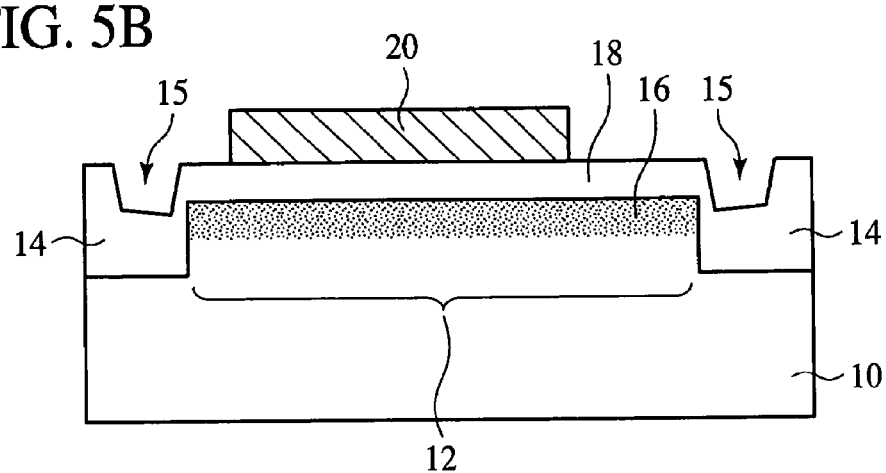

Next, as illustrated in FIG. 5A, the dielectric film 18 of a silicon oxide film 18 is formed by thermal oxidation. The film thickness of the dielectric film 18 is about 14 nm. The temperature of the inside of the film forming chamber for forming the dielectric film 18 is about 800° C. The atmosphere inside the film forming chamber is an atmosphere mixing steam and DCE (Dichloroethane). The region 16 where the dopant impurity is heavily implanted is thermally oxidized to thereby form the dielectric film 18, in which the presence of the dopant impurity causes the accelerating oxidation, and the film thickness of the dielectric film 18 becomes relatively large.

Next, a polysilicon film with a dopant impurity implanted in is formed by, e.g., CVD. A condition for forming the polysilicon film is, e.g., about 620° C.

Then, the polysilicon film is patterned by photolithography. The polysilicon film is pattered not be present over the device isolation region 14. The upper electrode 20 is thus formed of the polysilicon film (see FIG. 5B).

Figure 5C:
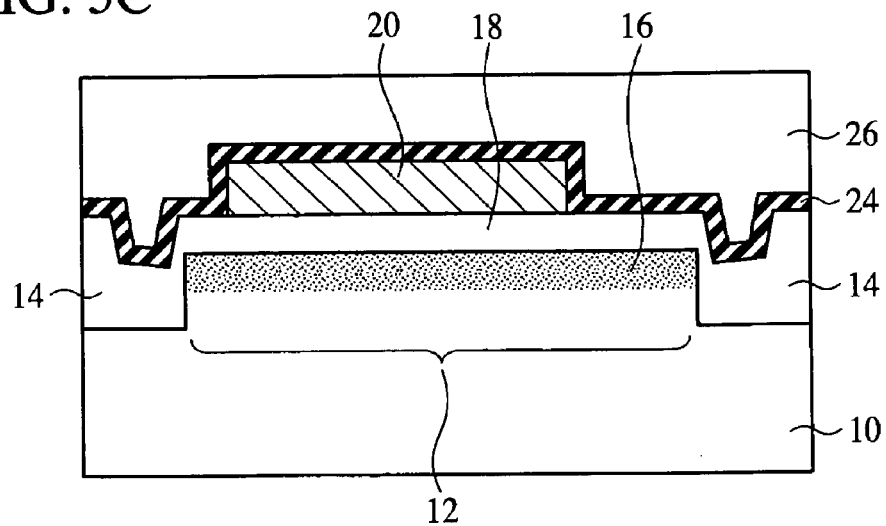

Then, as illustrated in FIG. 5C, a silicon nitride film 24 is formed on the entire surface by, e.g., plasma-enhanced CVD. The film thickness of the silicon nitride film 24 is, e.g., about 50 nm. The silicon nitride film 24 functions as an etching stopper film.

Next, the inter-layer insulation film 26 of, e.g., a silicon oxide film is formed on the entire surface by, e.g., CVD. The film thickness of the inter-layer insulation film 26 is, e.g., about 950 nm.

Then, the surface of the inter-layer insulation film 26 is polished. The surface of the inter-layer insulation film 26 is thus flattened.

Figure 6A:
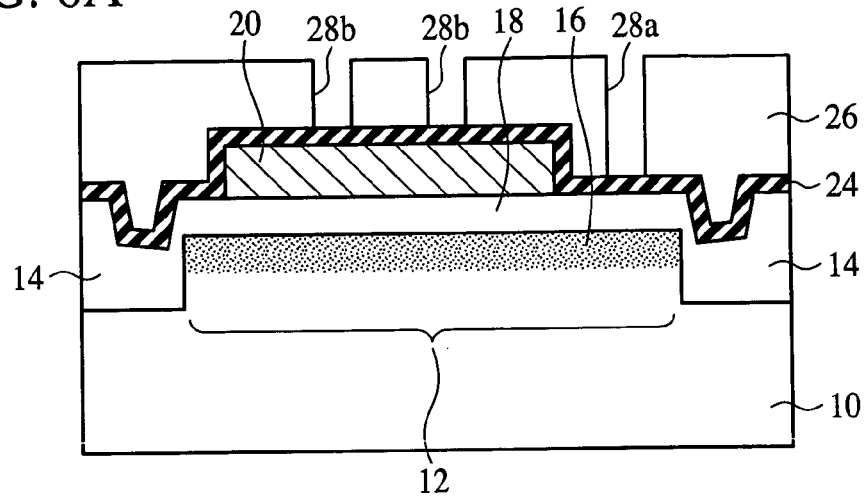
FIGS. 6A to 6C are sectional views of the capacitor according to the first embodiment of the present invention in the steps of the method for fabricating the capacitor, which illustrate the method (Part 3).

Then, as illustrated in FIG. 6A, with the silicon nitride film 24 as the etching stopper, the contact holes 28a, 28b are formed in the inter-layer insulation film 26 by photolithography. Dry etching is used to form the contact holes 28a, 28b in the inter-layer insulation film 26. The etching gas is, e.g., a CF-based etching gas. The etching system is, e.g., a high density plasma etching system. The inter-layer insulation film 26 is etched with a high selectivity ratio to the silicon nitride film 24, whereby the etching can be stopped by the silicon nitride film 24 without failure.

Figure 6B:
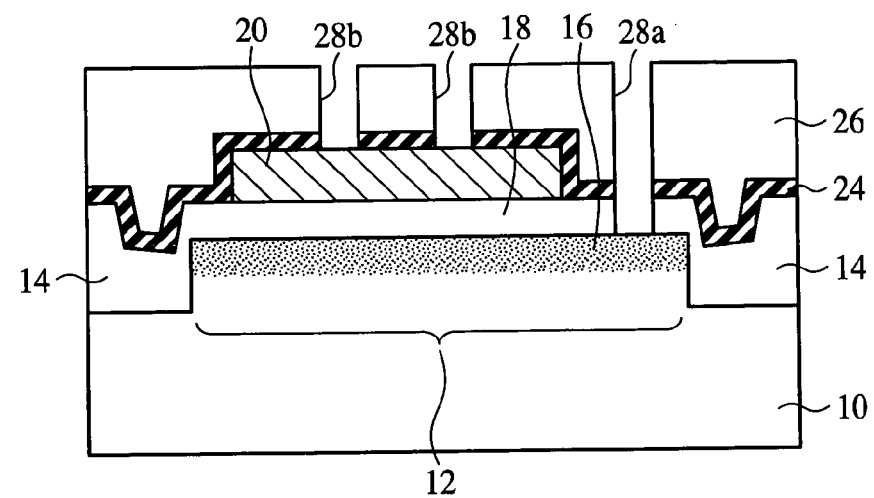
Figure 6C:
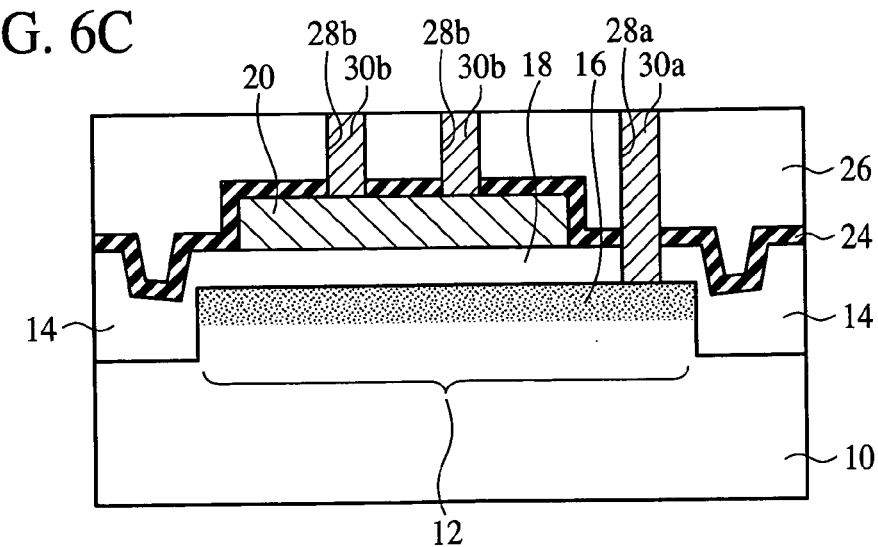

Next, as illustrated in FIG. 6B, the silicon nitride film 24, etc. exposed in the contact holes 28a, 28b are etched. The contact hole 28b and the contact hole 28a are thus formed respectively down to the upper electrode 20 and the lower electrode 16.

Then, a titanium film (not illustrated) and a titanium nitride film (not illustrated) are sequentially formed by, e.g., CVD. A barrier metal film (not illustrated) is thus formed of the titanium film and titanium nitride film. The film thickness of the titanium film is, e.g., about 10 nm. The film thickness of the titanium nitride film is, e.g., about 20 nm.

Then, a tungsten film is formed by, e.g., CVD. The film thickness of the tungsten film is, e.g., about 300 nm.

Next, the tungsten film and the barrier metal film are polished by, e.g., CMP until the surface of the inter-layer insulation film 26 is exposed. Thus, the conductor plugs (contact plugs) of the tungsten are buried in the contact holes 28a, 28b (see FIG. 6C).

Thus, the semiconductor device according to the present embodiment is fabricated.

One main characteristics of the capacitor according to the present embodiment is that the lower electrode 16 is formed in contact with the device isolation region 14, while the upper electrode 20 is not formed over the device isolation region 14.

According to the present embodiment, the upper electrode 20 is not formed over the device isolation region 14, which can prevent the short-circuit between the upper electrode 20 and the lower electrode 16 in the cavity 15 of the device isolation region 14. The capacitor according to the present embodiment can have high reliability.

Another main characteristic of the capacitor according to the present embodiment is that the etching stopper film 24 is formed, covering the capacitor 22.

In the first step of the etching for forming the contact holes 28a, 28b, the inter-layer insulation film 26 is etched with the silicon nitride film 24 as the etching stopper film and with a high selectivity, whereby the silicon nitride film 24 can stop the etching without failure. In the second step of the etching for forming the contact holes 28a, 28b, the silicon nitride film 24, etc. to be removed are so thin that the etching rate can be very easily controlled. Thus, according to the present embodiment, the lower electrode 16 and the upper electrode 20 are prevented from being damaged. Accordingly, the capacitor according to the present embodiment can have higher reliability.

The technique of the invention of the present application that the short-circuit between the upper electrode and the lower electrode in the cavity of the device isolation region can be prevented is neither disclosed nor suggested in any one of Patent Reference 1 to 3.

The technique of the invention of the present application that the upper electrode and the lower electrode are prevented from being damaged by using the etching stopper film whereby improve the reliability of the capacitor is neither disclosed nor suggested in any one of Patent Reference 1 to 3.

A Second Embodiment

Figure 7A:
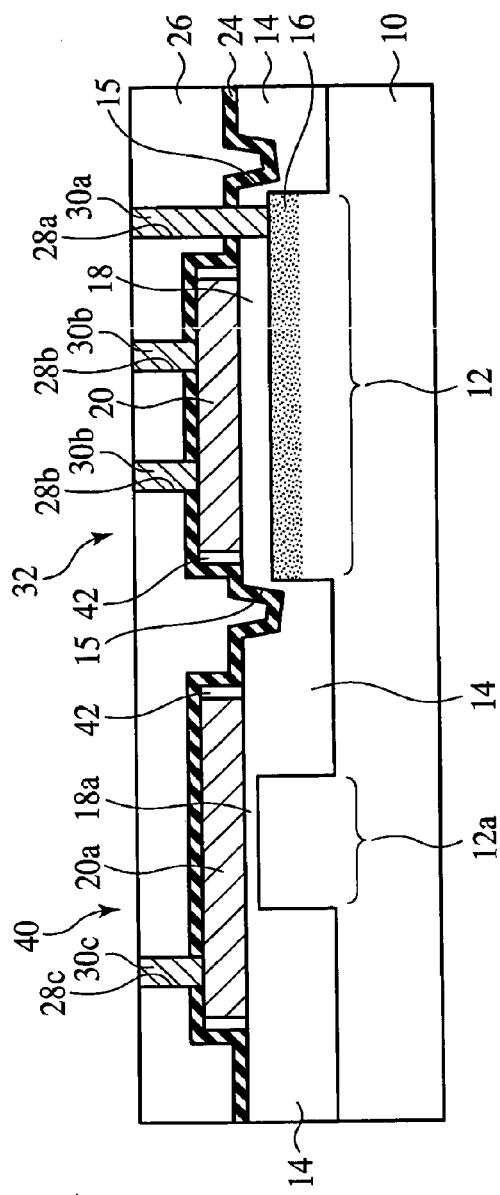
FIGS. 7A and 7B are a sectional view and a plane view of the semiconductor device according to a second embodiment of the present invention.
Figure 7B:
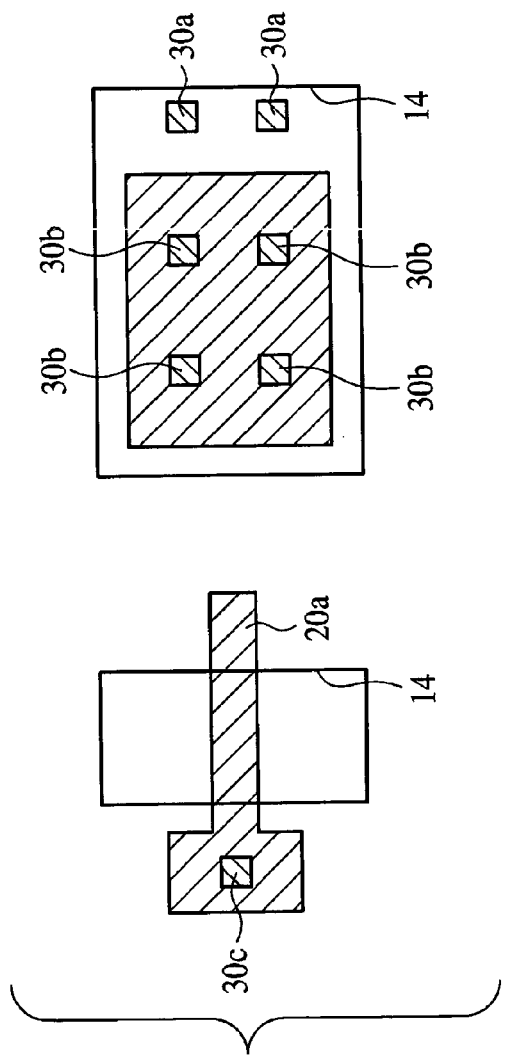

The semiconductor device according to a second embodiment of the present invention and the method for fabricating the semiconductor device will be explained with reference to FIGS. 7A to 11B. FIG. 7A is a sectional view of the semiconductor device according to the present embodiment. FIG. 7B is a plane view of the semiconductor device according to the present embodiment. The same members of the present embodiment as those of the capacitor according to the first embodiment and the method for fabricating the capacitor illustrated in FIGS. 1A to 6C are represented by the same reference numbers not to repeat or to simplify their explanation.

(The Semiconductor Device)

The semiconductor device according to the present embodiment is characterized mainly in that semiconductor elements, such as a transistor 40, etc. and the capacitor 32 according to the first embodiment are formed on one and the same semiconductor substrate 10.

As illustrated in FIGS. 7A and 7B, a gate insulation film 18a is formed on the surface of a device region 12a defined by the device isolation region 14. The film thickness of the gate insulation film 18a is smaller than the film thickness of the dielectric film 18. The film thickness of the gate insulation film 18a is, e.g., 7 nm. The gate insulation film 18a of the transistor 40 is formed thinner than the dielectric film 18 of the capacitor 32, because the device region 12a where a dopant impurity is not heavily implanted in the device region 12a for the transistor 40 to be formed in, and the accelerating diffusion does to take place. The gate insulation film 18a formed in the device region 12a without a heavily dopant implantation has good quality.

A gate electrode 20a is formed over the device region 12a and the device isolation region 14. The gate electrode 20a is formed of, e.g., polysilicon film with a dopant impurity implanted in. The upper electrode of the capacitor 32 and the gate electrode 20a of the transistor 40 are formed of the one and the same conducting film.

A sidewall insulation film 42 is formed on the side wall of the gate electrode 20a. The sidewall insulation film 42 is formed of, e.g., a silicon oxide film.

A source/drain diffused layer (not illustrated) is formed in the device region 12a on both side of the gate electrode 20a with the sidewall insulation film 42 formed on.

The etching stopper film 24 is formed on the transistor 40 and the capacitor 32.

The inter-layer insulation film 26 is formed on the etching stopper film 24.

A contact hole 28c is formed in the inter-layer insulation film 26 and the etching stopper film 24 down to the gate electrode 20a.

A conductor plug 30c is buried in the contact hole 28c.

Thus, the semiconductor device according to the present embodiment is fabricated.

(The Method for Fabricating the Semiconductor Device)

Next, the method for fabricating the semiconductor device according to the present embodiment will be explained with reference to FIGS. 8A to 11B. FIGS. 8A to 11B are sectional views of the semiconductor device according to the present embodiment in the steps of the method for fabricating the semiconductor device, which illustrate the method.

Figure 8A:
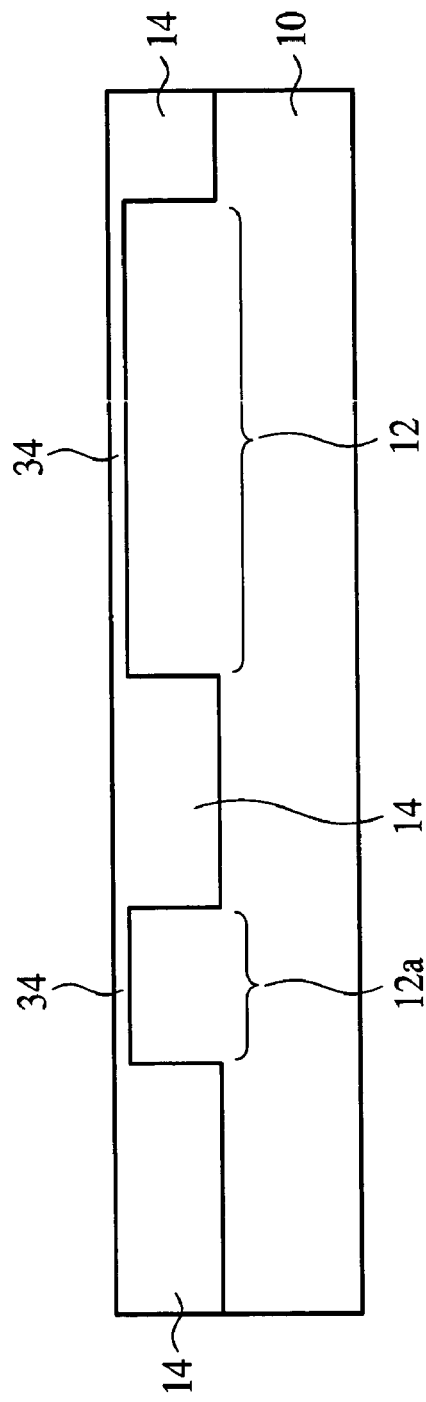
FIGS. 8A and 8B are sectional views of the semiconductor device in the steps of the semiconductor device fabricating method according to the second embodiment of the present invention (Part 1).

First, as illustrated in FIG. 8A, the device isolation region 14 for defining the device regions 12, 12a is formed by, e.g., STI. Thus, the device region 12 for the capacitor 32 to be formed in, and the device region 12 for the transistor 40 to be formed in are defined by the device isolation region 14.

Next, the sacrifice oxidation film 34 is formed on the surface of the semiconductor substrate 10 by thermal oxidation.

Next, a dopant impurity is implanted in the device regions 12, 12a to form, e.g., P type wells (not illustrated) in the semiconductor substrate 10.

Figure 8B:
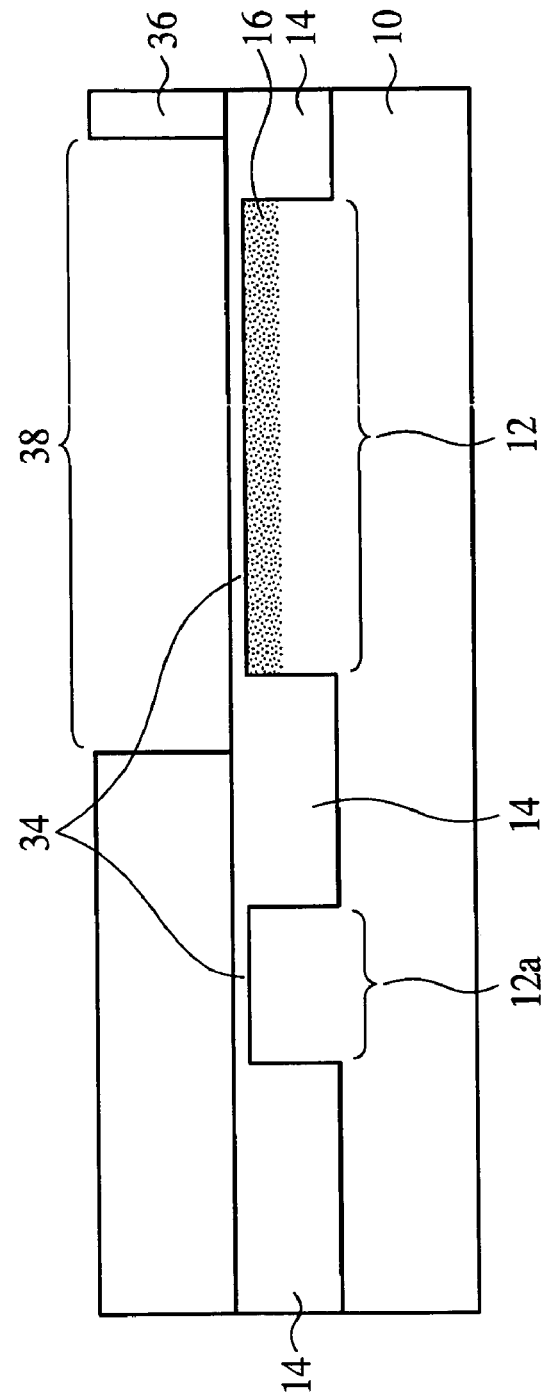

Next, as illustrated in FIG. 8B, a photoresist film 36 is formed on the entire surface by spin coating.

Next, the opening 38 is formed in the photoresist film 36 by photolithography. The opening 38 is formed, exposing not only the device region 12 but also the device isolation region 14 around the device region 12.

Next, with the photoresist film 36 as the mask, a dopant impurity is implanted in the device region 12 by, e.g., ion implantation. At this time, the dopant impurity is implanted also in the device isolation region 14 around the device region 12. The dopant impurity is implanted into the semiconductor substrate 10 through the sacrifice oxidation film 34. The dopant impurity is, e.g., arsenic ($As^+$). Conditions for the ion implantation are, e.g., 60 keV acceleration voltage and $1.0 \times 10^{15}$ cm$^{-2}$ dose.

Then, the sacrifice oxidation film 34 on the surface of the semiconductor substrate 10 is etched off by using, e.g., a hydrofluoric acid solution.

Then, as illustrated in FIG. 9A, the silicon oxide film 18, 18a are formed on the surface of the semiconductor substrate 10 by thermal oxidation. The silicon oxide film 18 formed in the device region 12 is to be the dielectric film of the capacitor 32. The silicon oxide film 18a formed in the device region 12a is to the gate insulation film 18a of the transistor 40. The dielectric film 18 and the gate insulation film 18a are formed at an about 800° C. internal temperature of the film forming chamber. The atmosphere in the film forming chamber is an atmosphere mixing steam and DCE (Dichloroethane). In the device region 12, the dielectric film 18, which is formed by thermally oxidizing the surface of the heavily doped impurity diffused layer 16, has a relatively large film thickness $d_1$ due to the accelerating oxidation caused by the presence of the dopant impurity. On the other hand, in the device region 12a, where the dopant impurity is not heavily implanted, the accelerating oxidation does not take place, and the film thickness $d_2$ of the gate insulation film 18a is relatively small. The film thickness $d_1$ of the dielectric film 18 is about 14 nm, and the film thickness $d_2$ of the gate insulation film 18a is, e.g., 7 nm.

Then, a polysilicon film is formed by, e.g., CVD. A condition for forming the polysilicon film is, e.g., about 620° C.

Next, the polysilicon film is patterned by photolithography to form the upper electrode 18 and the gate electrode 18a. The polysilicon film is patterned for the upper electrode 18 not to present over the device isolation region 14. On the other hand, as for the gate electrode 18a, the polysilicon film is patterned for the gate electrode 18a to be positioned over the device region 12 and the device isolation region 14 (see FIG. 9B). The cavity 15 is not formed in the device isolation region 14 near the device isolation region 12a, whereby the gate electrode 18a formed over the device isolation region 14 can be prevented from short-circuiting with the device region 12a.

Figure 10A:
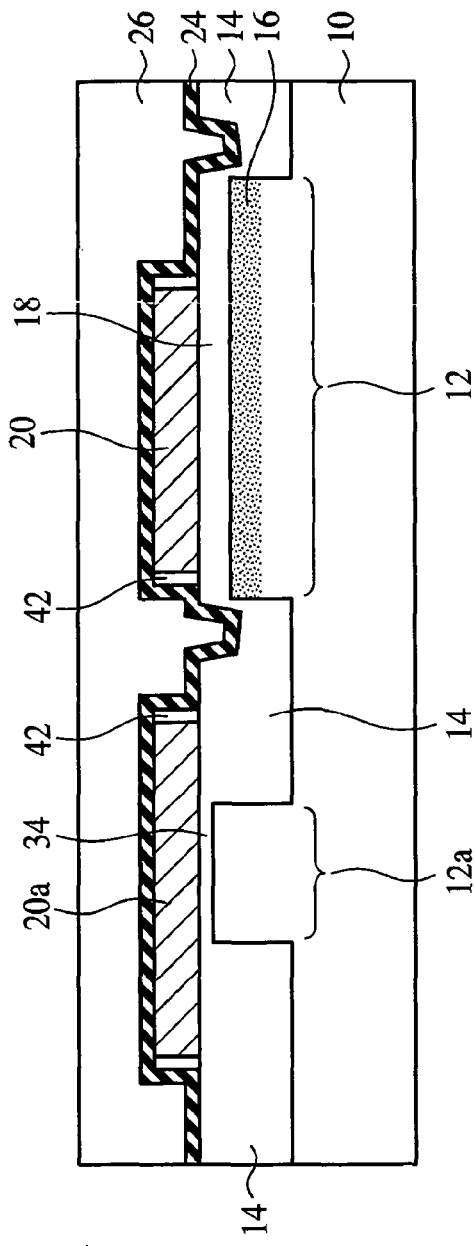
FIGS. 10A and 10B are sectional views of the semiconductor device in the steps of the semiconductor device fabricating method according to the second embodiment of the present invention (Part 3).

Next, as illustrated in FIG. 10A, the silicon nitride film 24 is formed on the entire surface by, e.g., plasma-enhanced CVD. The film thickness of the silicon nitride film 24 is, e.g., about 50 nm. The silicon nitride film 24 functions as the etching stopper film.

Then, the inter-layer insulation film 26 is formed on the entire surface by, e.g., CVD. The film thickness of the inter-layer insulation film 26 is, e.g., about 950 nm.

Next, the surface of the inter-layer insulation film 26 is polished. The surface of the inter-layer insulation film 26 is thus planarized.

Figure 10B:
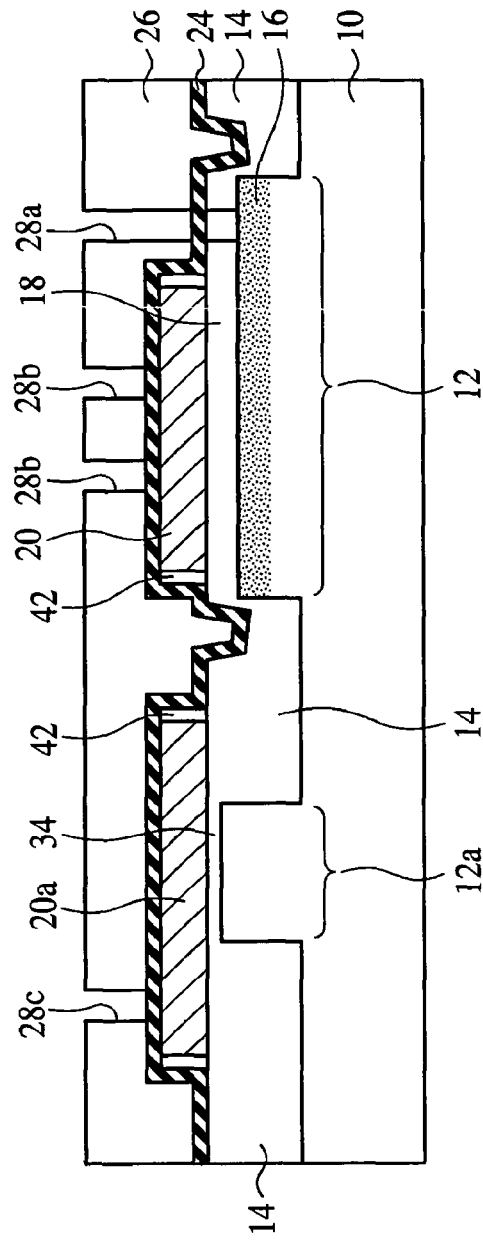

Then, as illustrated in FIG. 10B, with the silicon nitride film 24 as the etching stopper, the contact holes 28a-28c are formed in the inter-layer insulation film 26 by photolithography. The contact holes 28a-28c are formed in the inter-layer insulation film 26 by dry etching. The etchant gas is, e.g., a CF-based etching gas. The etching system is, e.g., a high density plasma etching system. The inter-layer insulation film 26 is etched with a high selectivity ratio to the silicon nitride film 24, whereby the silicon nitride film 24 can stop the etching without failure.

Figure 11A:
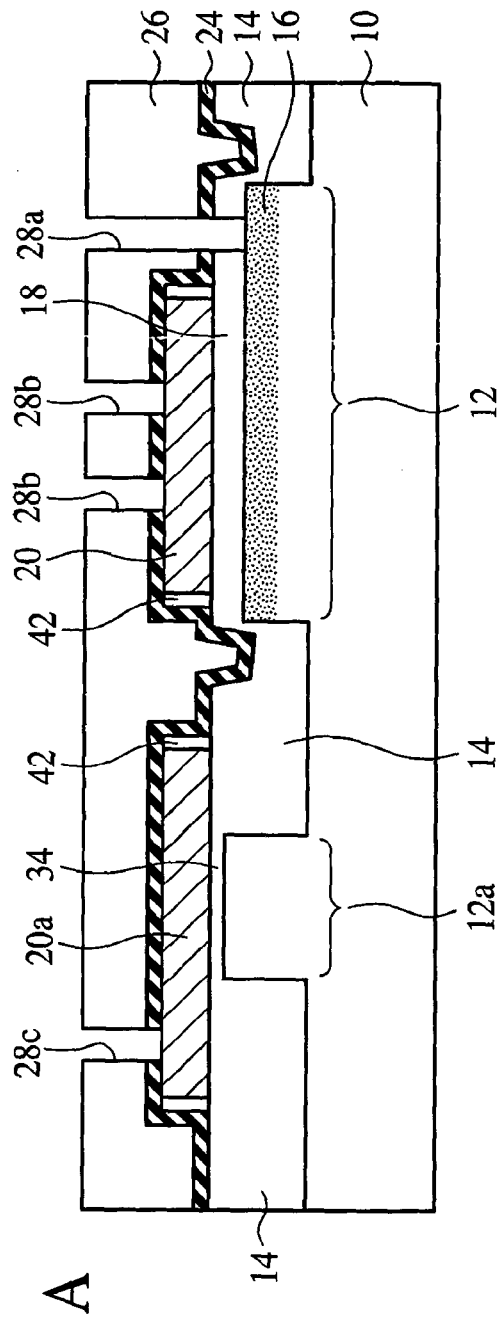
FIGS. 11A and 11B are sectional views of the semiconductor device in the steps of the semiconductor device fabricating method according to the second embodiment of the present invention (Part 4).

Then, as illustrated in FIG. 11A, the silicon nitride film 24, etc. exposed in the contact holes 28a-28c are etched. The contact hole 28b, the contact hole 28a and the contact hole 28c are thus formed respectively down to the upper electrode 20, the lower electrode 16 and the gate electrode 20a.

Next, the titanium film (not illustrated) and the titanium nitride film (not illustrated) are sequentially formed by, e.g., CVD. Thus, the barrier metal film (not illustrated) of the titanium film and titanium nitride film is formed. The film thickness of the titanium film is, e.g., about 10 nm. The film thickness of the titanium nitride film is, e.g., about 20 nm.

Next, a tungsten film is formed by, e.g., CVD. The film thickness of the tungsten film is, e.g., about 300 nm.

Then, the tungsten film and the barrier metal film are polished by, e.g., CMP until the surface of the inter-layer insulation film 26 is exposed. The conductor plugs 30a-30c of tungsten are thus buried in the contact holes 28a-28c.

Figure 11B:
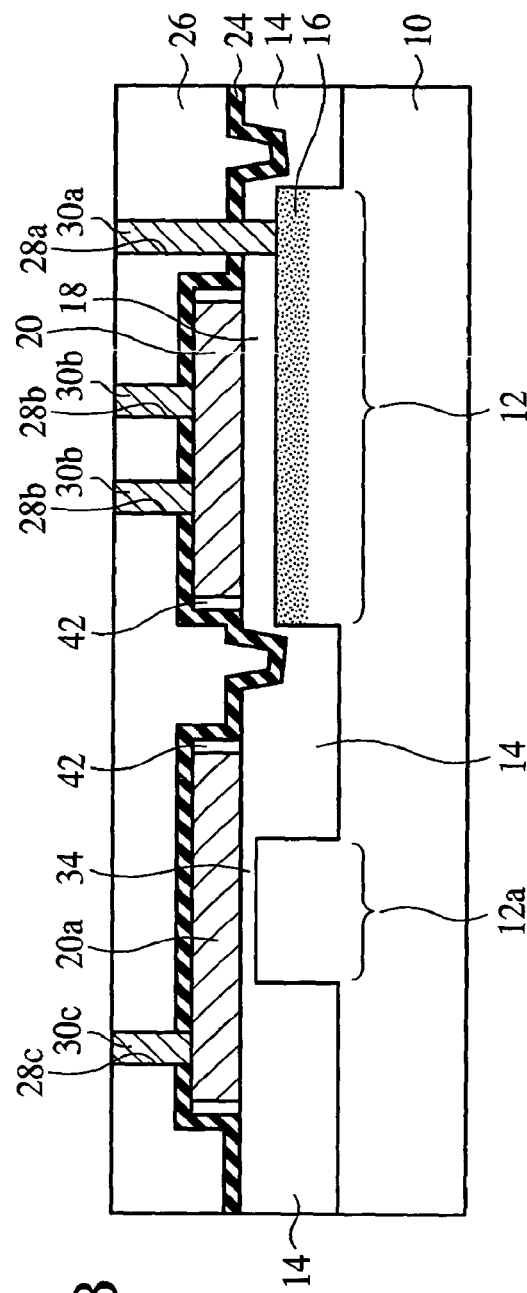

Thus, the semiconductor device according to the present embodiment is fabricated (see FIG. 11B).

The semiconductor device according to the present embodiment is characterized mainly in that, as described above, the transistor 40, and the capacitor 32 according to the first embodiment are formed on one and the same semiconductor substrate 10.

According to the present embodiment, the capacitor 32 has high reliability, accordingly the semiconductor device can have high reliability.

Modified Embodiments

The present invention is not limited to the above-described embodiments and can cover other various modifications.

For example, in the above-described embodiments, the lower electrode is of $N^+$ conduction type. However, the lower electrode is not essentially of $N^+$ conduction type. For example, it is possible that an N type well is formed in the device region 12, and a $P^+$ type lower electrode is formed in the N type well.

What is claimed is:

1. A capacitor comprising:
   a device region formed on a semiconductor substrate;
   a device isolation region formed outside the device region on the semiconductor substrate;
   a lower electrode formed in the device region, and formed of an impurity diffused layer, the lower electrode having an upper surface and an edge thereof;
   a dielectric film formed of a thermal oxide film formed over the lower electrode;
   an upper electrode formed over the dielectric film;
   an insulation layer formed over the semiconductor substrate, covering the upper electrode;
   a first conductor plug buried in a first contact hole which is connected to the lower electrode; and
   a second conductor plug buried in a second contact hole which is connected to the upper electrode,
   wherein a cavity is formed in the device isolation region adjacent to the edge of the lower electrode,
   wherein the dielectric film has a first part covering the upper surface of the lower electrode, and a second part covering the edge of the lower electrode, the second part including a portion having a thickness smaller than that of the first part, the thickness of the first part being measured in a direction perpendicular to a primary surface of the semiconductor substrate, the thickness of the second part being measured in a direction parallel to the primary surface of the semiconductor substrate, the first part and the second part being formed of one and the same dielectric film, and
   wherein the upper electrode is formed over the first part of the dielectric film, while the upper electrode is not formed directly over the second part of the dielectric film,
   wherein a peak value of an impurity concentration in the lower electrode is more than $1 \times 10^{20}$ cm$^{-3}$,
   wherein an entire upper surface of the lower electrode except a portion connected to the first conductor plug is covered with the dielectric film.

2. A capacitor according to claim 1, wherein the device isolation region is buried in a trench formed in the semiconductor substrate.

3. A capacitor according to claim 1, further comprising an etching stopper film formed over the upper electrode and the lower electrode below the insulation layer and having etching characteristics different from those of the insulation layer,
   wherein the first contact hole and the second contact hole are formed in the insulation layer and the etching stopper film.

4. A capacitor according to claim 1, wherein
   the semiconductor substrate is a silicon substrate, and
   the upper electrode is formed of polysilicon.

5. A capacitor according to claim 1, wherein
   a part of a top surface of the device isolation region is lower than the top surface of the lower electrode.

* * * * *